(12) United States Patent
Lim

(10) Patent No.: US 7,402,479 B2
(45) Date of Patent: Jul. 22, 2008

(54) CMOS IMAGE SENSOR AND FABRICATING METHOD THEREOF

(75) Inventor: Youn-Sub Lim, Chungcheongbuk-do (KR)

(73) Assignee: MagnaChip Semiconductor, Ltd., Chungcheonbuk-Do (KR)

( * ) Notice: Subject to any disclaimer, the term of this patent is extended or adjusted under 35 U.S.C. 154(b) by 399 days.

(21) Appl. No.: 11/123,298

(22) Filed: May 6, 2005

(65) Prior Publication Data
US 2005/0266625 A1    Dec. 1, 2005

(30) Foreign Application Priority Data
May 6, 2004    (KR) .................... 10-2004-0032001

(51) Int. Cl.
*H01L 21/8238*    (2006.01)
(52) U.S. Cl. .............................. 438/200; 257/E21.634
(58) Field of Classification Search .................. 438/200, 438/529, 533, 549; 257/E21.634
See application file for complete search history.

(56) References Cited

U.S. PATENT DOCUMENTS

2003/0151076 A1*    8/2003   Kim .......................... 257/233

* cited by examiner

*Primary Examiner*—Chandra Chaudhari
(74) *Attorney, Agent, or Firm*—Blakely, Sokoloff, Taylor & Zafman LLP

(57) ABSTRACT

A fabricating method of a CMOS image sensor includes the steps of: forming a transfer gate on a semiconductor substrate where a device isolation layer is formed; forming a first n-type ion implantation region for a photodiode beneath a surface of the semiconductor substrate, the first n-type ion implantation region being aligned at one side of the transfer gate and having a first width and a first ion implantation depth; forming a second n-type ion implantation region aligned at one side of the transfer gate, the second n-type ion implantation region enclosing the first n-type ion implantation region and having a second width wider than the first width and a second ion implantation depth deeper than the first ion implantation depth and a second depth; forming a p-type ion implantation region between a surface of the semiconductor substrate and the first n-type ion implantation region, the p-type ion implantation region being aligned at one side of the transfer gate and partially overlapped with the first n-type ion implantation region; forming spacers on both sidewalls of the transfer gate; and forming a floating diffusion region at the other side of the transfer gate.

11 Claims, 5 Drawing Sheets

도 3C

CMOS IMAGE SENSOR AND FABRICATING METHOD THEREOF

FIELD OF THE INVENTION

The present invention relates to a CMOS image sensor; and, more particularly, to a CMOS image sensor and a fabricating method thereof, in which a second $P^0$ ion implantation process is omitted in fabricating a photodiode, while forming a dual structure of an n-type ion implantation region for the photodiode, thereby preventing degradation of a device characteristic due to nonuniformity of the second $P^0$ ion implantation and securing charge transport efficiency.

DESCRIPTION OF RELATED ART

An image sensor is an apparatus to convert an optical image into an electrical signal. Such an image sensor is largely classified into a complementary metal oxide semiconductor (CMOS) image sensor and a charge coupled device (CCD).

In the case of the CCD, individual MOS capacitors are disposed very close to one another and charge carriers are stored in the capacitors and transferred. Meanwhile, in the case of the CMOS image sensor, a pixel array is constructed using a technology of fabricating CMOS integrated circuit and output data are detected in sequence through a switching operation.

FIG. 1 is a circuit diagram of a unit pixel of a conventional CMOS image sensor. The unit pixel includes one photodiode 100 and four MOS transistors 101, 103, 104 and 105. The photodiode 100 receives light to generate photoelectric charges. The transfer transistor 101 transfers the photoelectric charges accumulated in the photodiode 100 to a floating diffusion region 102. The reset transistor 103 sets a potential of the floating diffusion region 102 to a desired value and resets the floating diffusion region 102. The drive transistor 104 serves as a source follower buffer amplifier having a gate receiving a voltage of the floating diffusion region 102. The select transistor 105 performs an addressing function through a switching operation. A load transistor 106 is disposed outside of the unit pixel so as to read an output signal.

Among the fabricating processes of the CMOS image sensor, a process of forming the photodiode is the most important in the implementation of the optic characteristics. In order to enhance low luminance characteristic, a p-type ion implantation region is formed on an uppermost layer of the photodiode by performing a p-type ion implantation process two times.

FIGS. 2A and 2B are sectional views illustrating a fabricating process of a conventional CMOS image sensor.

Referring to FIGS. 2A and 2B, a device isolation layer 12 is formed on a p-type semiconductor substrate 11 to define an active region and a field region. At this point, the p-type semiconductor substrate 11 can be provided with a stack structure of a high-concentration p-type substrate and a low-concentration p-type epitaxial layer.

Then, various gate electrodes including a gate electrode of the transfer transistor are patterned. Hereinafter, the gate electrode of the transfer transistor will be referred to as a transfer gate.

Next, an n-type ion implantation region (or a deep N region) 14 for the photodiode is formed beneath the semiconductor substrate 11 and is aligned at one side of the transfer gate 13. Thereafter, an ion implantation process is carried out to form a p-type ion implantation region (or a $P^0$ region) for the photodiode.

That is, the process of forming the n-type ion implantation region (or the deep N region) 14 for the photodiode is carried out and sequentially the p-type ion implantation is carried out using the same mask, such that a first p-type ion implantation region 15 is formed on the n-type ion implantation region 14 for the photodiode.

Referring to FIG. 2B, spacers are formed on both sidewalls of the gate electrode. That is, after a spacer insulating layer is deposited to a predetermined thickness on the semiconductor substrate including the transfer gate, an entire-surface etching process is carried out to form the spacers on both sidewalls of the gate electrode.

After the process of forming the spacers, a thin oxide layer 17 remains on the surface of the photodiode. In such a state that the oxide layer remains, a blanket second p-type ion implantation process (second $P^0$) is carried out without using a mask and thus a second p-type ion implantation region 18 is formed as shown in FIG. 2B.

Here, the second p-type ion implantation region 18 is formed on the n-type ion implantation region 14 and is aligned with the gate spacer 16 such that the second p-type ion implantation region 18 is in contact with the first p-type ion implantation region 15.

In case where the first and second p-type ion implantation regions 18 and 15 have the doping profile as shown in FIG. 2B, a fringing field helping the charge transport is generated. Consequently, it is advantageous to the charge transport efficiency.

However, before the second p-type ion implantation process, the thickness of the remaining oxide layer 17 is different depending on the chips and its variation is very great. Therefore, its uniform adjustment is difficult.

Because the thickness of the remaining oxide layer serving as the buffer layer in the ion implantation is not uniform, ion implantation depth of the second p-type ion implantation region is also not uniform. Therefore, direct influence on chip characteristics causes the problems in process stability and yield.

SUMMARY OF THE INVENTION

It is, therefore, an object of the present invention to provide a CMOS image sensor and a fabricating method thereof, in which a second $P^0$ ion implantation process is omitted in fabricating a photodiode, while forming a dual structure of an n-type ion implantation region for the photodiode, thereby preventing degradation of a device characteristic due to nonuniformity of the second $P^0$ ion implantation and securing charge transport efficiency.

In an aspect of the present invention, there is provided a fabricating method of a CMOS image sensor, including the steps of: forming a transfer gate on a semiconductor substrate where a device isolation layer is formed; forming a first n-type ion implantation region for a photodiode beneath a surface of the semiconductor substrate, the first n-type ion implantation region being aligned at one side of the transfer gate and having a first width and a first ion implantation depth; forming a second n-type ion implantation region aligned at one side of the transfer gate, the second n-type ion implantation region enclosing the first n-type ion implantation region and having a second width wider than the first width and a second ion implantation depth deeper than the first ion implantation depth and a second depth; forming a p-type ion implantation region between a surface of the semiconductor substrate and the first n-type ion implantation region, the p-type ion implantation region being aligned at one side of the transfer gate and partially overlapped with the first n-type ion implantation region; forming spacers on both sidewalls of the transfer gate; and forming a floating diffusion region at the other side of the transfer gate.

In another aspect of the present invention, there is provided a CMOS image sensor, including: a transfer gate formed on a semiconductor substrate where a device isolation layer; a first n-type ion implantation region for a photodiode, formed beneath a surface of the semiconductor substrate, the first n-type ion implantation region being aligned at one side of the transfer gate and having a first width and a first ion implantation depth; a second n-type ion implantation region aligned at one side of the transfer gate, the second n-type ion implantation region enclosing the first n-type ion implantation region and having a second width wider than the first width and a second ion implantation depth deeper than the first ion implantation depth and a second depth; a p-type ion implantation region formed between a surface of the semiconductor substrate and the first n-type ion implantation region, the p-type ion implantation region being aligned at one side of the transfer gate and partially overlapped with the first n-type ion implantation region; spacers formed on both sidewalls of the transfer gate; and a floating diffusion region formed at the other side of the transfer gate.

In accordance with the present invention, the second p-type ion implantation process (second $P^0$ process) is omitted. Instead, a double n-type ion implantation region is formed to thereby enhance the charge transport efficiency and device characteristics such as a dark bad pixel without any degradation of device uniformity.

For this, the doping profile and dose of the n-type ion implantation region formed beneath the spacer of the transfer gate are tuned differently from other portions.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

FIGS. 3A to 3D are sectional views illustrating a method for fabricating a CMOS image sensor in accordance with an embodiment of the present invention.

Figure 1A:
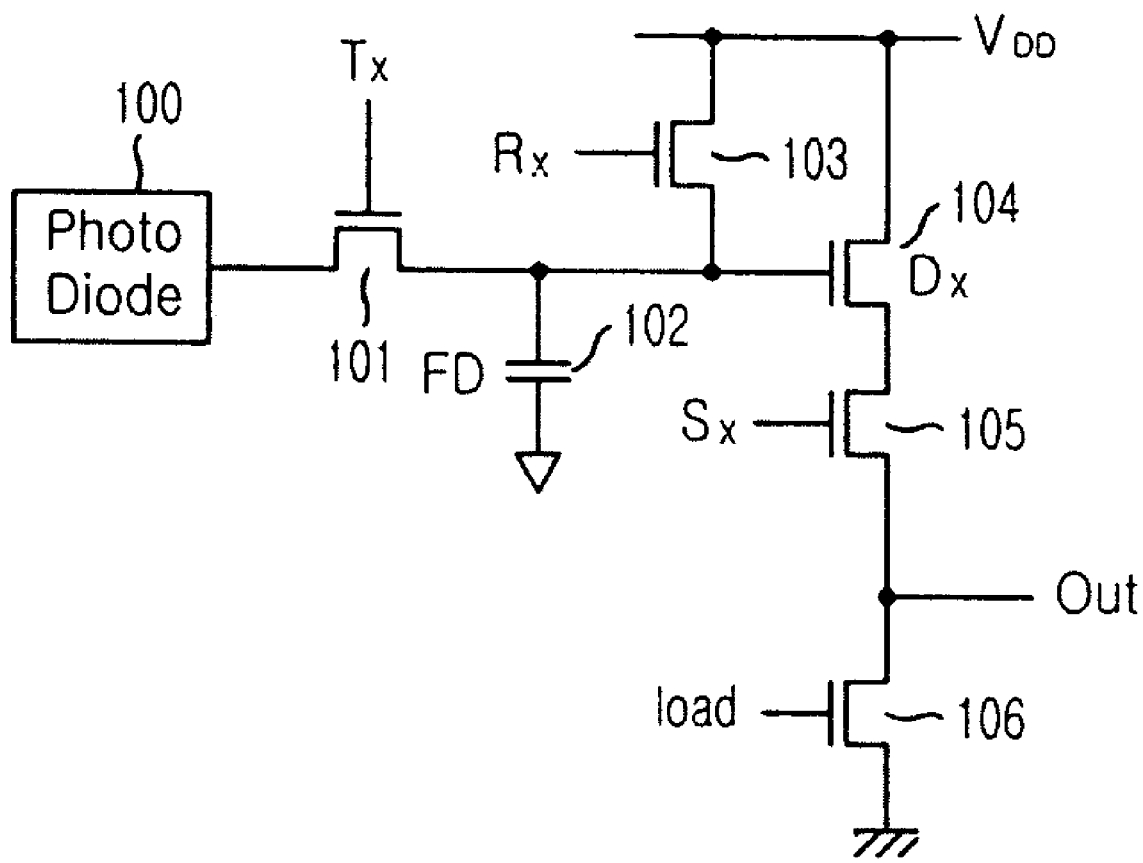
FIG. 1 is a circuit diagram of a unit pixel of a conventional CMOS image sensor.
Figure 2A:
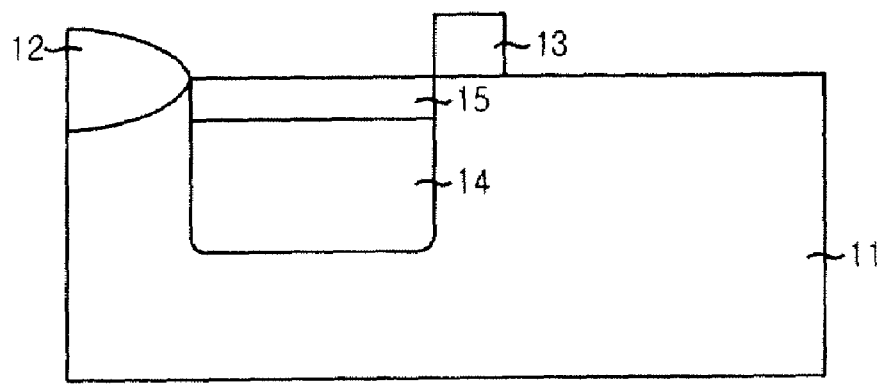
FIGS. 2A and 2B are sectional views illustrating a method for fabricating a conventional CMOS image sensor.
Figure 2B:
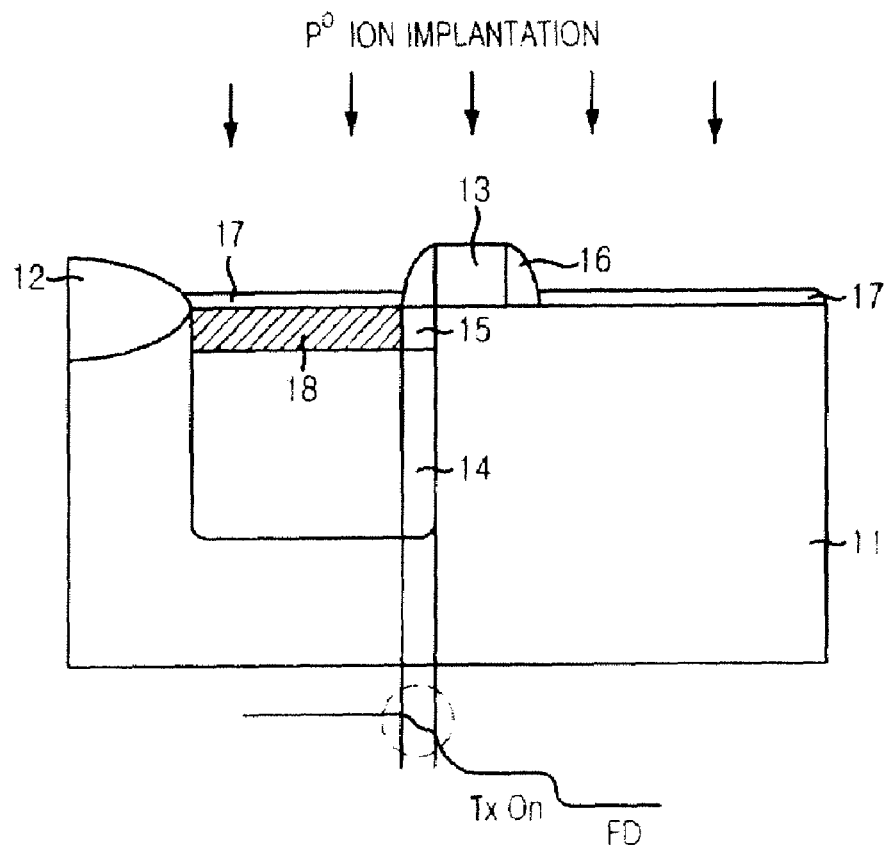
Figure 3A:
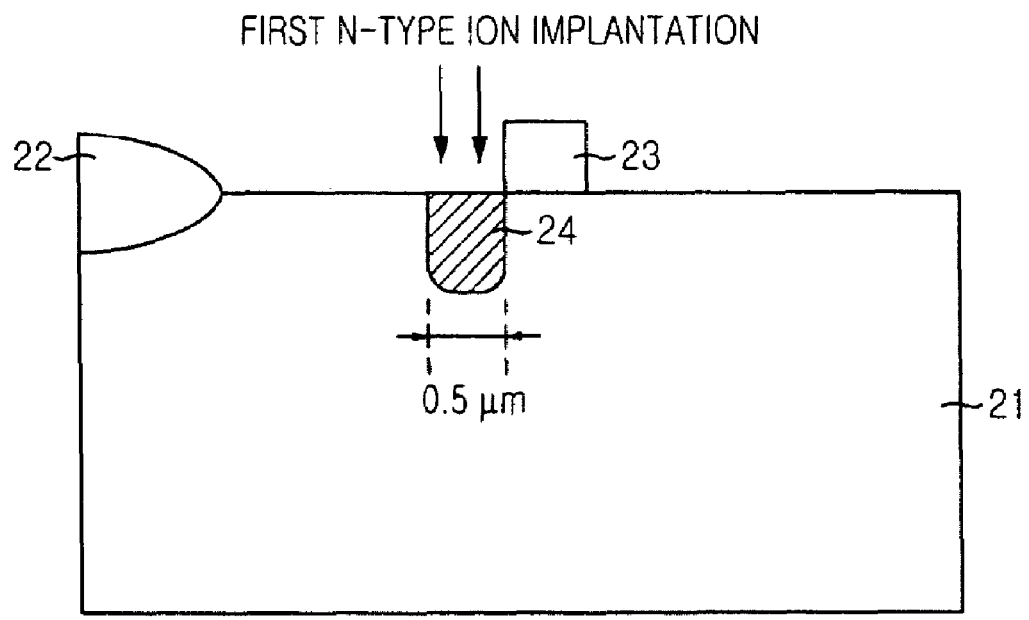
FIGS. 3A to 3D are sectional views illustrating a method for fabricating a CMOS image sensor in accordance with a preferred embodiment of the present invention.
Figure 3A:
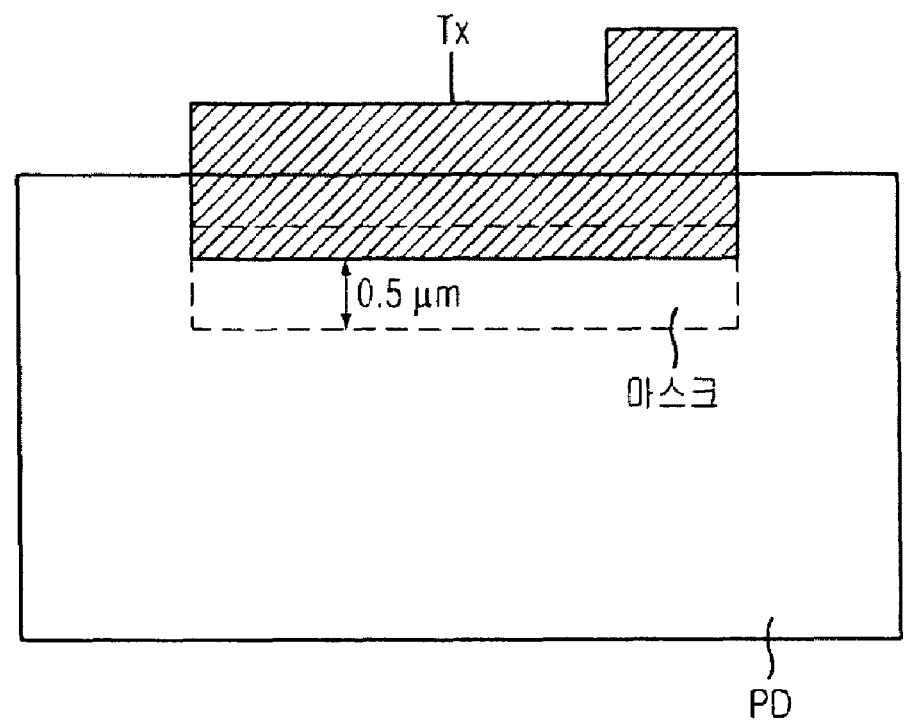

Referring to FIG. 3A, a device isolation layer 22 is formed on a semiconductor substrate 21 to define an active region and a field region. A stack structure of a high-concentration semiconductor substrate and a low-concentration epitaxial layer can be used for the semiconductor substrate.

When the stack structure is used, a depth of a depletion layer of a photodiode formed on the epitaxial layer increases and thus a charge storage ability of the photodiode increases. Also, the high-concentration substrate can prevent a crosstalk occurring between adjacent unit pixels.

The device isolation layer 22 can be formed using a local oxidation of silicon (LOCOS) technology. In addition, a shallow trench isolation (STI) using a trench can be applied.

Then, a gate insulating layer (not shown) and a gate conductive material 23 are sequentially formed on the semiconductor substrate, and a gate electrode of the transistor is patterned by a patterning process using an appropriate mask.

In FIG. 3A, only the gate electrode 23 of the transfer transistor contacting with the photodiode is shown and the remaining transistors (reset transistor or drive transistor) of the unit pixel are not shown. Hereinafter, the gate electrode 23 of the transfer transistor will be referred to as a transfer gate.

After forming the transfer gate, a first n-type ion implantation region 24 for the photodiode is formed at one side of the transfer gate.

It is preferable that a width of the first n-type ion implantation region 24 for the photodiode is about 0.5 μm and a length thereof is identical to that of the transfer gate.

Also, the first n-type ion implantation process is carried out under a condition that its dose and ion implantation energy are reduced much more than those of the second n-type ion implantation process.

That is, a dose in the first n-type ion implantation process for the photodiode is smaller than a dose in the second n-type ion implantation process by about $0.2 \times 10^{12}$, and the first n-type ion implantation process uses an ion implantation energy of about 60 KeV. Further, the ion-implanted depth of the first n-type ion implantation region 24 is lower than the conventional n-type ion implantation region.

A mask used to form the first n-type ion implantation region 24 is shown in FIG. 3A. The mask is aligned with the square photodiode, the transfer gate and the transfer gate, and its width is about 0.5 μm.

An exposed length of the mask is substantially identical to the length of the transfer transistor. In this embodiment, because the mask of FIG. 3A is used, the length of the first n-type ion implantation region 24 is identical to the length of the transfer gate. However, the mask can also be longer than the transfer gate.

Figure 3B:
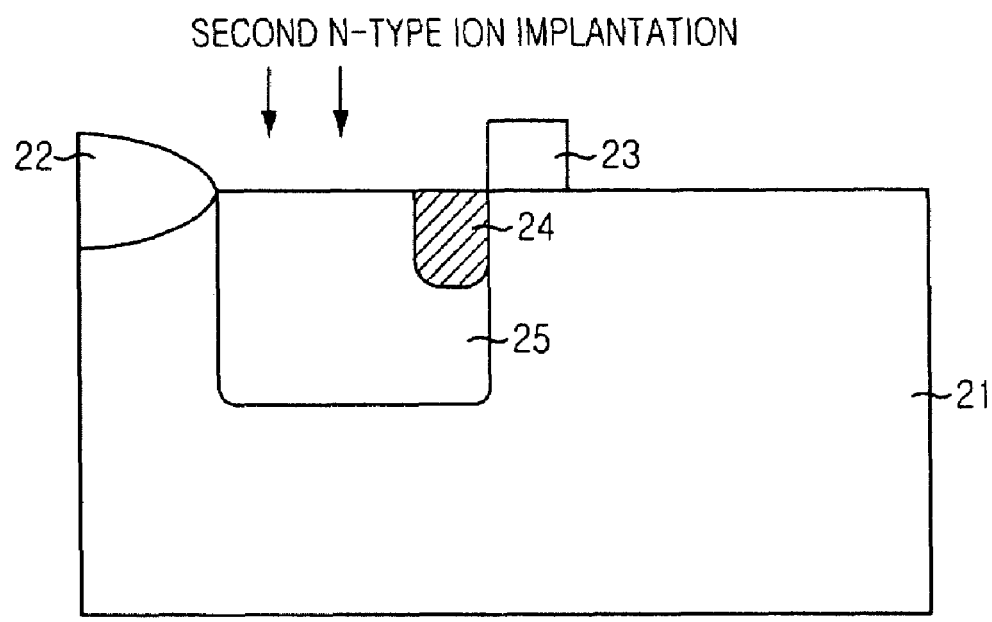
Figure 3B:
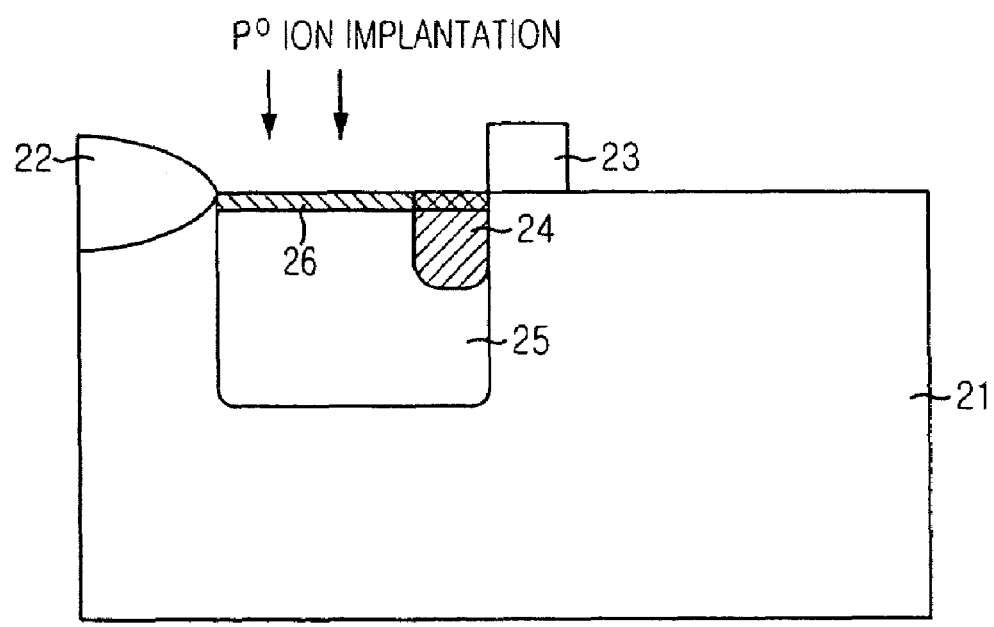

Referring to FIG. 3B, after the formation of the first n-type ion implementation region 24, a second n-type ion implantation region 25 is formed.

That is, a second n-type ion implantation region is formed deeply beneath the substrate and is aligned at one edge of the transfer gate 23 by using a mask (not shown).

The ion implantation process of forming the second n-type ion implantation region 25 is a process that is normally used in the prior art. Consequently, the ion implantation regions 24 and 25 can be obtained as shown in FIG. 3B.

Then, a p-type ion implantation process using the same mask is carried out. That is, a p-type ion implantation region 26 partially overlapped with the first n-type ion implantation region 24 is formed on the second n-type ion implantation region 25.

Figure 3D:
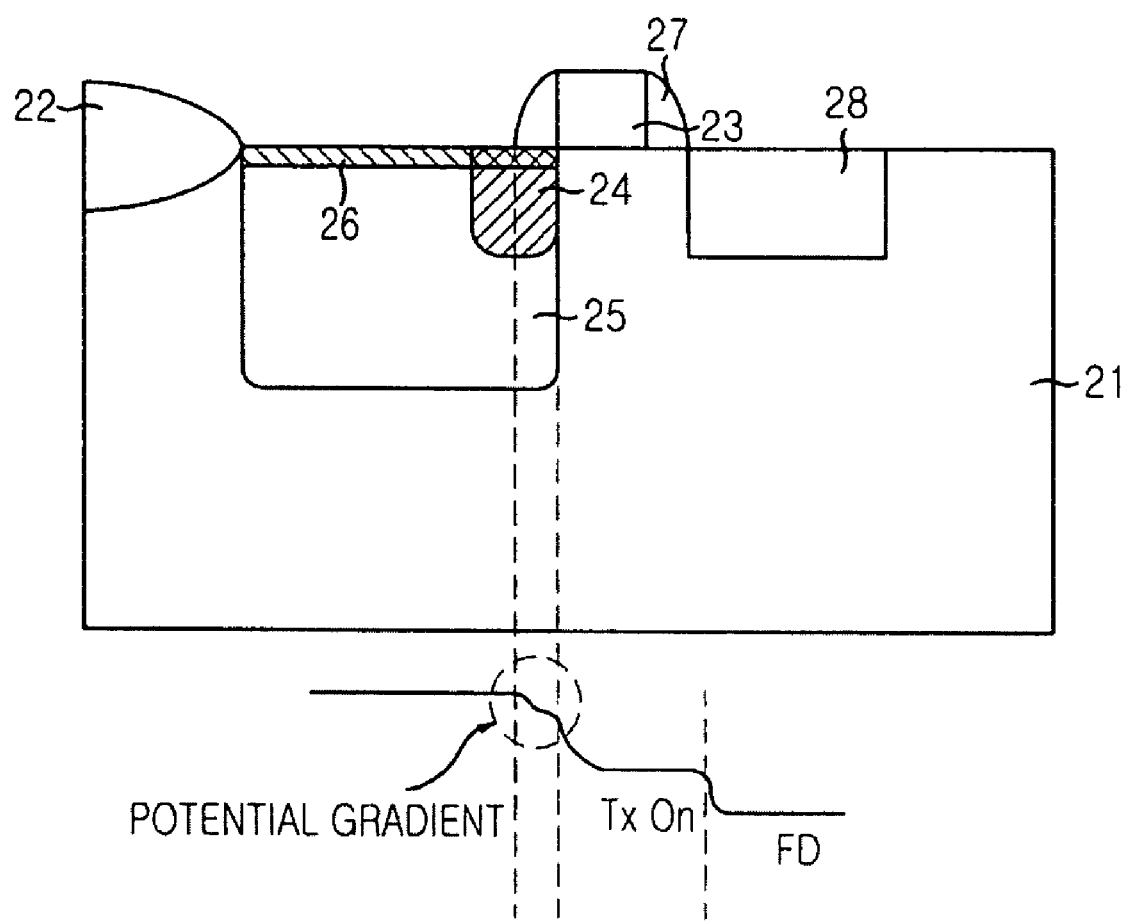
Figure 3A:
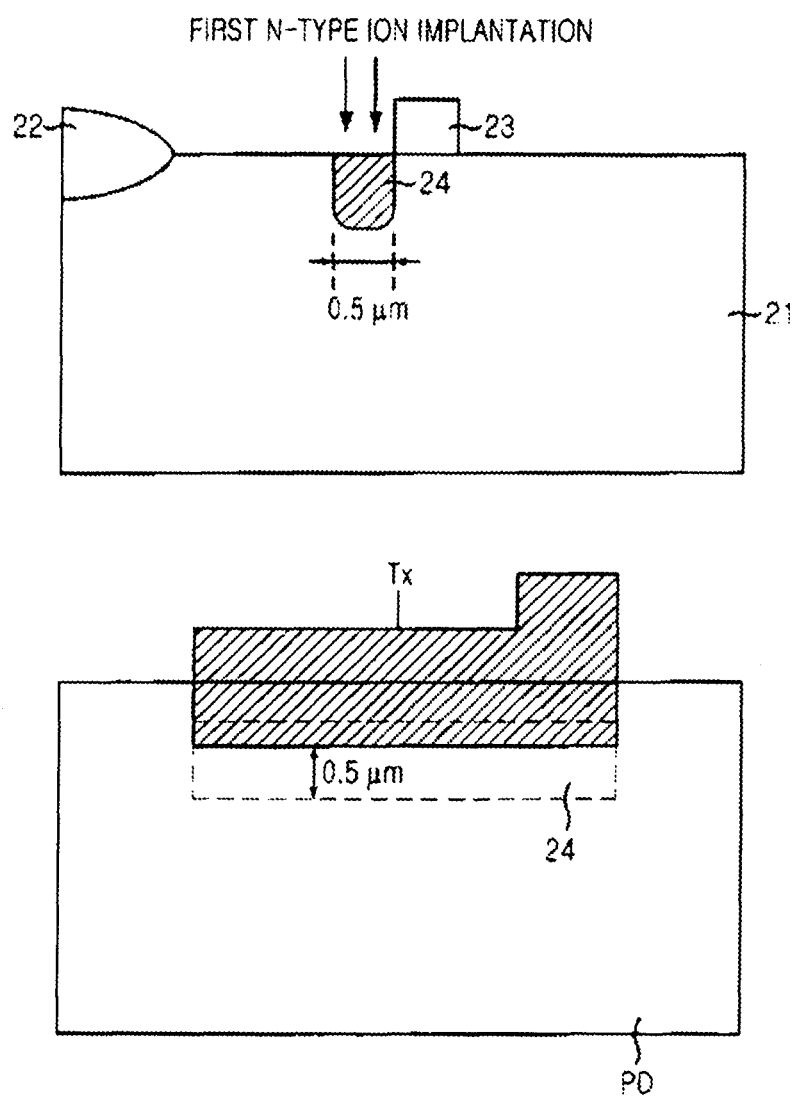
Figure 3B:
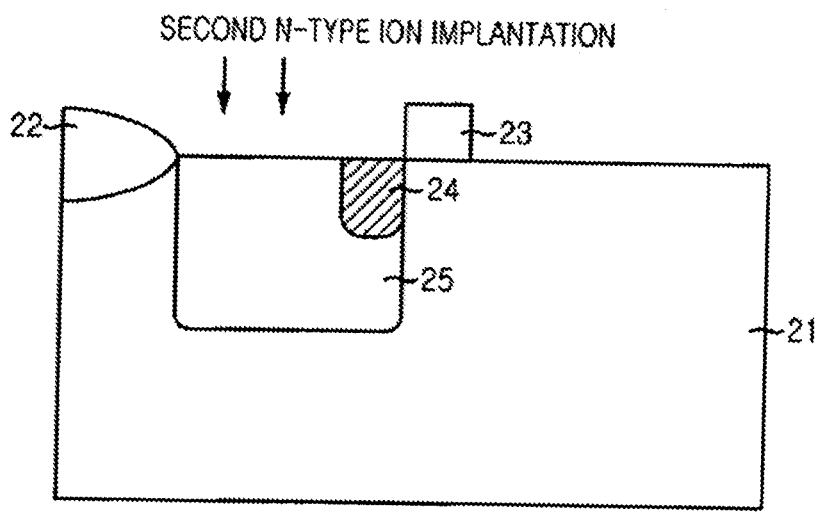

Referring to FIG. 3D, spacers 27 are formed on both sidewalls of the transfer gate and a floating diffusion region 28 is formed on the other side of the transfer gate.

Potential distributions of the photodiode region, the transfer gate and the floating diffusion region when the transfer gate is turned on are shown in FIG. 3D.

In accordance with the present invention, even when the second $P^0$ ion implantation process is omitted, a fringing field advantageous to the charge transport can be obtained because of the double n-type ion implantation regions of the photodiode.

Further, the second $P^0$ ion implantation process that must be carried out in a state that the non-uniform oxide layer remains is omitted. Therefore, it is possible to prevent inconstant device characteristics, which have been caused by different thickness in the second P⁰ ion implantation at each chip.

As described above, the present invention can solve the problems of the process margin deficiency, the yield variation and the optical characteristic deviation, which are caused by the nonuniformity in the thickness of the oxide layer remaining after etching the spacers. Further, the charge transport efficiency can be secured, thereby contributing to the competitiveness and characteristic stability of the image sensor.

The present application contains subject matter related to Korean patent application No. 2004-32001, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A fabricating method of a CMOS image sensor, comprising the steps of:
   forming a transfer gate on a semiconductor substrate where a device isolation layer is formed;
   forming a first n-type ion implantation region aligned at one side of the transfer gate beneath a region reserved for a spacer of the transfer gate with a first mask, wherein the first n-type ion implantation region has a first width and a first ion implantation depth;
   forming a second n-type ion implantation region aligned at one side of the transfer gate with a second mask to enclose the first n-type ion implantation region, wherein the second n-type ion implantation region has a second width greater than the first width and a second ion implantation depth greater than the first ion implantation depth;
   forming a p-type ion implantation region between a surface of the semiconductor substrate and the first n-type ion implantation region with the second mask, the p-type ion implantation region aligned at one side of the transfer gate and partially overlapped with an upper portion of the first n-type ion implantation region;
   forming spacers on both sidewalls of the transfer gate; and
   forming a floating diffusion region at the other side of the transfer gate.

2. The method as recited in claim 1, wherein the first width is 0.5 μm.

3. The method as recited in claim 1, wherein the first n-type ion implantation region has a length identical to that of the transfer gate.

4. The method as recited in claim 1, wherein the first n-type ion implantation region is formed using an ion implantation energy of 60 KeV.

5. The method as recited in claim 1, wherein a dose used to form the first n-type ion implantation region is less than a dose used to form the second n-type ion implantation region by $0.2 \times 10^{12}$.

6. A fabricating method of a CMOS image sensor, comprising the steps of:
   forming a transfer gate on a semiconductor substrate where a device isolation layer is formed;
   forming a first n-type ion implantation region aligned at one side of the transfer gate beneath a region reserved for a spacer of the transfer gate with a first mask, wherein the first n-type ion implantation region has a first width and a first ion implantation depth;
   forming a second n-type ion implantation region aligned at one side of the transfer gate with a second mask to enclose the first n-type ion implantation region, wherein the second n-type ion implantation region has a second width greater than the first width and a second ion implantation depth greater than the first ion implantation depth;
   forming a p-type ion implantation region aligned at one side of the transfer gate with the second mask by implanting p-type ions into upper portions of the first n-type ion implantation region and the second n-type ion implantation region, to thereby reduce a concentration of the p-type ions in the upper portion of the first n-type ion implantation region;
   forming spacers on both sidewalls of the transfer gate; and
   forming a floating diffusion region at the other side of the transfer gate.

7. The method as recited in claim 6, wherein the concentration of the p-type ions in the upper portion of the first n-type ion implantation region is smaller than a concentration of the p-type ions in the upper portion of the second n-type ion implantation region.

8. The method as recited in claim 6, wherein the first width is 0.5 μm.

9. The method as recited in claim 6, wherein the first n-type ion implantation region has a length identical to that of the transfer gate.

10. The method as recited in claim 6, wherein the first n-type ion implantation region is formed using an ion implantation energy of 60 KeV.

11. The method as recited in claim 6, wherein a dose used to form the first n-type ion implantation region is less than a dose used to form the second n-type ion implantation region by $0.2 \times 10^{12}$.

* * * * *

UNITED STATES PATENT AND TRADEMARK OFFICE
CERTIFICATE OF CORRECTION

| | | |
|---|---|---|
| PATENT NO. | : 7,402,479 B2 | Page 1 of 3 |
| APPLICATION NO. | : 11/123298 | |
| DATED | : July 22, 2008 | |
| INVENTOR(S) | : Youn-Sub Lim | |

Figure 3C:
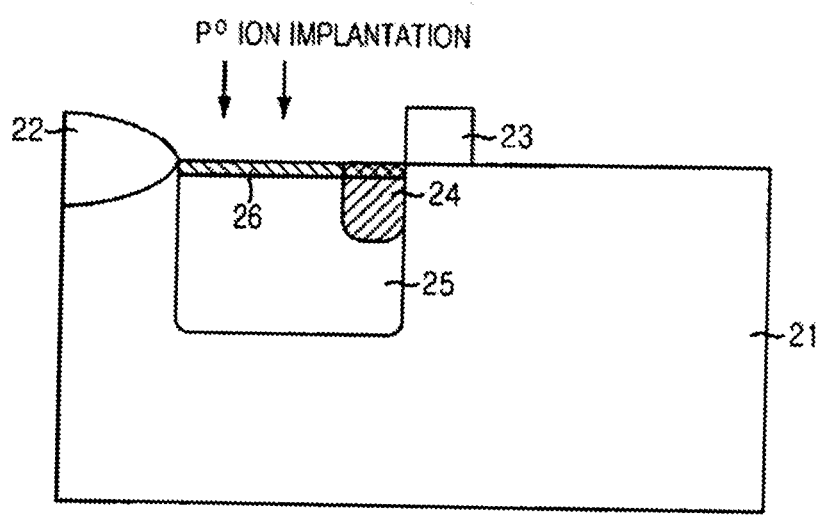

It is certified that error appears in the above-identified patent and that said Letters Patent is hereby corrected as shown below:

Replacement sheet for FIG. 3A replaces the Korean characters therein with the number --24--; and, Replacement sheet for FIG. 3C replaces the Korean characters therein with the word --FIG.--.

Signed and Sealed this

Third Day of August, 2010

David J. Kappos
*Director of the United States Patent and Trademark Office*